United States Patent
Ho et al.

(10) Patent No.: US 7,130,222 B1
(45) Date of Patent: Oct. 31, 2006

(54) NONVOLATILE MEMORY WITH PROGRAM WHILE PROGRAM VERIFY

(75) Inventors: Wen Chiao Ho, Tainan (TW); Yi Chun Shih, Taipei (TW); Chin Hung Chang, Tainan (TW); Chun Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/235,881

(22) Filed: Sep. 26, 2005

(51) Int. Cl.
*G11C 11/34* (2006.01)

(52) U.S. Cl. .......................... 365/185.22; 365/185.28; 365/185.18

(58) Field of Classification Search .......... 365/185.22, 365/185.28, 185.18, 185.29
See application file for complete search history.

(56) References Cited

U.S. PATENT DOCUMENTS

| | | | |
|---|---|---|---|
| 5,579,262 A * | 11/1996 | Song ..................... | 365/185.22 |
| 5,638,326 A | 6/1997 | Hollmer et al. | |
| 5,748,535 A * | 5/1998 | Lin et al. ............... | 365/185.22 |
| 5,751,637 A | 5/1998 | Chen et al. | |
| 5,787,039 A | 7/1998 | Chen et al. | |
| 5,835,414 A | 11/1998 | Hung et al. | |
| 5,903,497 A * | 5/1999 | Yu et al. ................. | 365/185.22 |
| 6,108,238 A * | 8/2000 | Nakamura et al. ...... | 365/185.22 |
| 6,141,253 A | 10/2000 | Lin | |
| 6,714,457 B1 | 3/2004 | Hsu et al. | |

OTHER PUBLICATIONS

Lee, June et al., "High-Performance 1-Gb NAND Flash Memory with 0.12- μm Technology," IEEE Journal of Solid-State Circuits, vol. 37, No. 11, Nov. 2002.

Takeuchi, Ken et al., "A Multipage Cell Architecture for High-Speed Programming Multilevel NAND Flash Memories," IEEE Journal of Solid-State Circuits, vol. 33, No. 8, Aug. 1998.

* cited by examiner

*Primary Examiner*—Anh Phung
(74) *Attorney, Agent, or Firm*—Mark A. Haynes; Haynes, Beffel & Wolfeld

(57) ABSTRACT

A page mode program sequence is described that includes first and second bias applying cycles. In the first cycle, a program bias is applied to a first part of a page of memory cells, while a program verify bias is applied to, and data is sensed from, a second part of the page. In this manner, a first part of the page is programmed, while a second part of the page is verified. This operation is followed by a second bias applying cycle, in which a program bias is applied to the second part of the page, while a program verify bias is applied to, and data is sensed from, the first part of the page.

20 Claims, 7 Drawing Sheets

NONVOLATILE MEMORY WITH PROGRAM WHILE PROGRAM VERIFY

BACKGROUND OF THE INVENTION

1. Field of the Invention

The present invention relates to nonvolatile memory devices, including flash memory and page mode flash memory, which include program and program verify operations.

2. Description of Related Art

Nonvolatile memory devices typically include a memory array comprising memory cells that maintain their data even when electrical power has been removed from the device. There are a variety of types of nonvolatile memory devices. One type includes so-called "read-only memory," like mask ROM in which the data is stored in the memory cell by implanting impurities in the channel region of MOS transistors. The data stored in mask ROM devices, and other nonvolatile read-only memory devices, cannot be changed in the field. Another type of nonvolatile memory device includes electrically erasable and programmable memory cells, such as flash memory. The data stored in flash memory cells, and other nonvolatile electrically erasable and programmable memory cells, can be changed in the field using electronic programming and erasing procedures. Representative flash memory technologies include floating gate memory cells and charge trapping memory cells such as SONOS, NROM, PHINES and the like.

There are a variety of biasing procedures that are used for programming and erasing memory cells in flash memory. The biasing procedures for floating gate memory cells and charge trapping memory cells cause tunneling of electrons and/or holes into and out of the floating gates or charge trapping structures. The concentration of charge held in the floating gates or the charge trapping structures has an effect on the threshold voltage of the memory cell. Thus, by controlling the amount of charge held in the floating gates, or in the charge trapping structures, the threshold voltage of the memory cell can be set, and data stored.

Due to demand for faster access times combined with large, high-density arrays for flash memory, page read and burst read flash memories have been developed. In normal flash memory, the read operation is executed word by word so that within a specified time, such as time after address transition (TAA of for example 100 ns to 70 ns or less) or time after a chip enable signal (TCE), only one 16-bit word is addressed, its contents sensed, and its data output. In page mode devices, the input and output structures for the array may include a fast access buffer storing a page including for example, 1024 bits or 2048 bits, on the chip. The programming and reading procedures use the page buffer to improve throughput, and in some cases are set up to provide for addressing more than one word at a time, such as four words (64 bits) or more, during programming to and reading from the page buffer. Data stored in the page buffer can be read out in burst mode or otherwise with very short cycle times.

According to a typical process, to program a page in the array, a page buffer is loaded with data to be programmed, which is then transferred in chunks to bit latches associated with a set of sense amplifiers, including for example 32 or 64 sense amplifiers, coupled via decoding circuits to columns in the array, and programming the chunks of the page in parallel, with the program bias for each bit line being controlled by the data in the corresponding bit latch. A verify procedure for page mode programming can include automatically clearing the bits in the page buffer which correspond to cells that are successfully programmed. The data stored in the page buffer is then read to confirm that all bits have been cleared to indicate a successful page program operation.

As mentioned above, the operation to program the cells in a flash memory device typically involves a procedure that causes injection or ejection of charge into a charge storage structure that affects the threshold of the cell. The charge injection or ejection procedure must be tightly controlled for modern, high density operations. For multiple bit per cell embodiments, even greater control of the charge injection or ejection operation is required.

Because of the need for precise control of cell thresholds in memory devices along with variations in memory cell characteristics, variations in voltages applied, and variations in other parameters across an array, the biasing procedures used for programming and erasing operations in flash memory can result in non-uniform levels of charge stored in the cells distributed across the array. Therefore, the biasing procedures applied in many devices include a sequence of programming with verify operations between each pulse, or between each set of pulses. A typical verify process includes driving word line voltages to program verify levels, which are changed slightly from the standard read level in order to provide program or erase margin. Then, data is sensed from the memory cells to determine whether each cell has been successfully programmed or erased. If the verify process fails, then retry program pulses, followed by verify operations, are applied iteratively until a successful verify is achieved, or a maximum number of retries is reached.

For precise control of the threshold, memory devices are designed so that several iterations of the program and verify procedure may be required, that cause small increments in change of the threshold voltages for convergence on a target threshold level in a given cell on the device. The time required for a program operation therefore includes a plurality of cycles including both the program pulse and the program verify interval. See, U.S. Pat. No. 6,714,457 by Hsu et al.; U.S. Pat. No. 5,835,414 by Hung et al.; U.S. Pat. No. 5,748,535 by Lin et al.; U.S. Pat. No. 5,751,637 by Chen et al.; U.S. Pat. No. 5,787,039 by Chen et al.; U.S. Pat. No. 5,638,326 by Hollmer et al.; and U.S. Pat. No. 6,141,253 by Lin.

It is desirable to provide an architecture for nonvolatile memory and program and program verify procedures for such memory, that reduces the time required for the program operation while supporting precise control over memory cell threshold voltages.

SUMMARY OF THE INVENTION

The present invention provides a method for programming a nonvolatile memory device with input data in memory cells identified by respective memory cell addresses. The method includes loading a set of data to be stored in a set of memory cells in buffer circuitry, where the set of memory cells consists of memory cells that have identical higher order address bits, such as memory cells in a single page. A program sequence is executed that includes first and second bias applying cycles. In the first cycle, a program bias is applied to a first part of the set of memory cells, while a program verify bias is applied to, and data is sensed from, a second part of the set of memory cells. In this manner, a first part of the set of memory cells is programmed, while a second part of the set of memory cells is verified. This operation is followed by a second bias applying cycle, in which a program bias is applied to the second part of the set of memory cells, while a program verify bias is applied to, and data is sensed from, the first part of the set of memory cells. These two bias applying cycles result in a program pulse being applied to both the first and second parts of the set of memory cells. In an embodiment, the program sequence includes updating the set of data to be programmed in response to the sensing operation during the first and second bias applying cycles. If the updated set of data does not indicate success of the programming sequence, then the program sequence is retried using the updated set of data. This sequence of two bias applying cycles is repeated until both parts of the set of memory cells are successfully programmed. In this manner, the time required for verifying the programming of data in the set of memory cells is hidden within the time used for programming, saving substantial time in the overall program operation. The technology is suitable for devices in which when multiple program pulses are required to achieve tight control over the threshold voltages of the cells being programmed.

The nonvolatile memory device includes structures that support the program-while-verify bias cycles. For example, in one embodiment, the set of memory cells comprises cells in a row of cells in a memory array. The first part of the set of memory cells is coupled to a first word line along the row, and the second part of the set of memory cells is coupled to a second word line along the row. Thus, the array is split along the row, and each of the two word lines along the row has an independent word line driver activated in response to the same higher order address bits.

In one embodiment, the memory cells along the row are accessed by a page address, where a page includes a large number of cells such as 1024 or 2048 cells. The set of memory cells subject of the first and second bias applying cycles may comprise in this example 64 memory cells or 128 memory cells of the page. The first part of the set of memory cells may comprise a chunk of 16, 32 or 64 memory cells coupled to one of the word lines, while the second part of the set of memory cells may comprise a chunk of 16, 32 or 64 memory cells coupled to the second word line along the row. In another embodiment, the set of memory cells subject of the programming sequence comprises cells in a first row of memory cells in a first sector of the array coupled to a first word line and cells in a second row of memory cells in a second sector in the array coupled to a second word line. The first word line and the second word line are driven by independent word line drivers activated in response to the same higher order address bits, such that a page includes memory cells along a row in the first sector and memory cells along another row in the second sector.

An embodiment of the method includes storing a page of data in a buffer on the memory device, which is to be stored in a corresponding page of memory cells identified by a set of higher order address bits. Chunks of data from the buffer are loaded in bit latches coupled to the decoding circuitry. The program sequence comprising the first and second bias applying cycles is executed on a first chunk in the first part of the split page and a second chunk in the second part of the split page, repeatedly until the pair of chunks is successfully programmed, and then the next pair of chunks is loaded from the buffer to the bit latches, and programmed until all the data of the page is successfully programmed.

An integrated circuit is described supporting the program-while-verify method described above. The integrated circuit includes an array of memory cells including a plurality of bit lines and a plurality of word lines. Decoder circuitry is coupled to the plurality of bit lines and the plurality of word lines that is responsive to addresses to access memory cells in the array, and to selectively apply a program bias and a program verify bias to first and second word lines having common higher order address bits, such as a page address. Sense circuitry is coupled to the array, and arranged to sense data in a plurality of memory cells, such as a chunk of memory cells as discussed above, in parallel. Buffer circuitry is coupled to the array to support the program operations. In addition, a state machine or other circuitry is coupled to the array, decoder circuitry and buffer circuitry to control execution of program operations. The program operations include the methods described above.

In embodiments of the invention, the buffer circuitry comprises a page buffer which stores a page of data to be stored in a corresponding page of memory cells. In another embodiment, the buffer circuitry comprises a plurality of latches coupled with the decoder circuitry and associated with the sense amplifiers. The plurality of latches store a chunk of data from the page to be stored which indicates whether the memory cell on a corresponding bit line in the array needs programming during a particular bias applying cycle. In yet another embodiment, the buffer circuitry includes both a page buffer, and a plurality of latches as discussed above.

Technology described herein includes an integrated circuit memory architecture having a split page organization, where a program bias can be applied to a first part of the split page, while a program verify bias is applied to a second part of the split page. High speed page mode operations are supported, achieving improved control over threshold voltages achieved during programming, and reduced times required for programming because all or part of the time needed for program verify is hidden within the time needed for applying programming pulses.

Other aspects and advantages of the present invention can be seen on review of the drawings, the detailed description and the claims, which follow.

DETAILED DESCRIPTION

A detailed description of embodiments of the present invention is provided with reference to the FIGS. 1–7.

Figure 1:
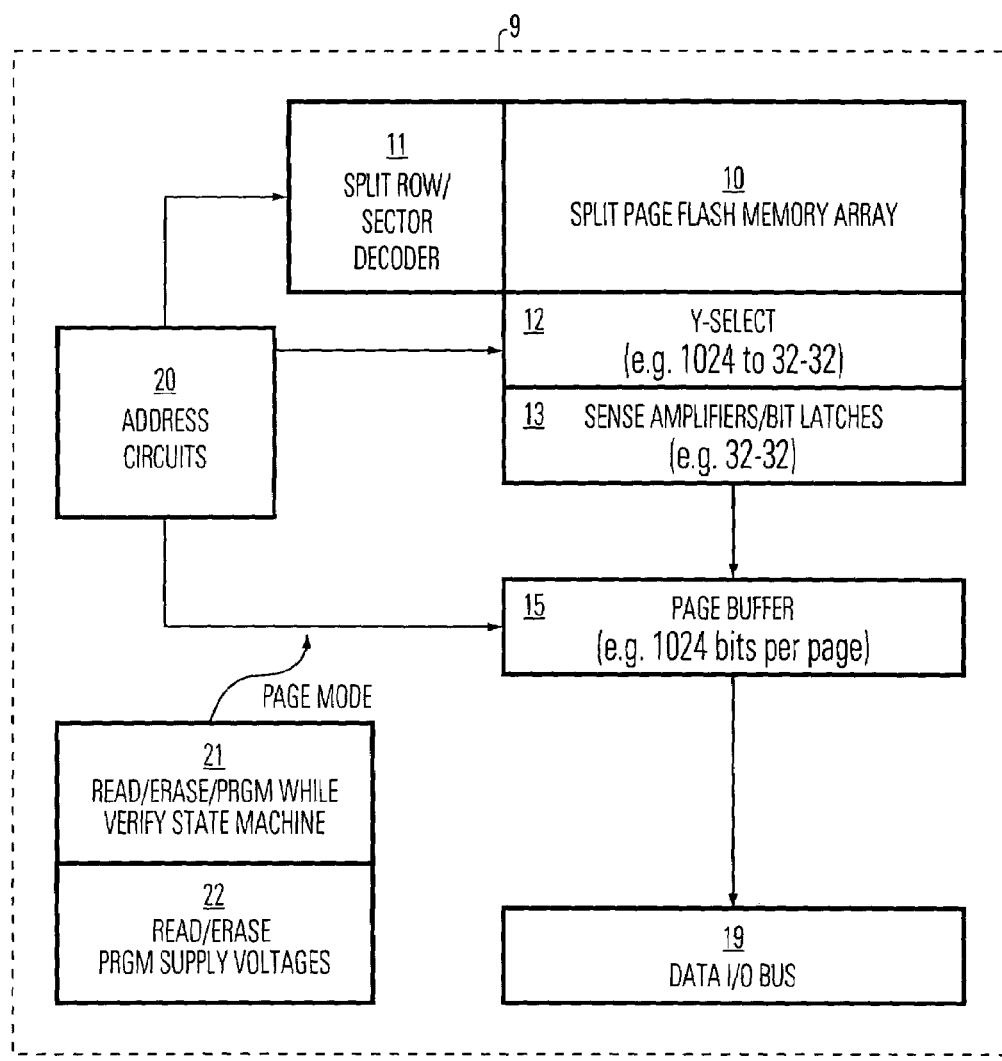
FIG. 1 is a block diagram of an integrated circuit including nonvolatile memory with program while program verify structures.

FIG. 1 is a simplified block diagram of a single chip, integrated circuit memory device 9 supporting page mode operations and program-while-verify operations. The memory device 9 includes a flash memory array 10 that includes an array of memory cells typically organized into a plurality of sectors, and accessible using a plurality of bit lines, a plurality of word lines and a plurality of sector select lines. A row decoder 11 is used for accessing selected word lines and sectors. The plurality of word lines include pairs of word lines that are accessed in response to identical higher order address bits, as explained below. A Y-select column decoder 12 is used for accessing selected bit lines. A plurality of sense amplifiers 13, or other sensing circuitry, is coupled to data lines from the output of the column decoder 12, and arranged to sense two chunks of data in parallel, where each chunk includes for example 32 bits.

In the illustrated example, a page of data includes 1024 bits. The two chunks together amount to 64 bits in this example, which can be read in parallel through 64 sense amplifiers coupled to the column decoder 12. The 64 bits correspond to four words, each of which includes two bytes that are 8 bits wide. Other embodiments include a greater number of bits per page, including for example 2048 bits per page or more, and larger or smaller chunks. The sense amplifiers 13, with associated bit latches used during program operations, are coupled to column decoder 12. The sense amplifiers 13 and bit latches are coupled to a page buffer 15, so that data can be moved from the sense amplifiers 13 to the page buffer 15 and from the page buffer 15 to the bit latches in support of read, erase and program operations.

Addressing circuits 20 are included on the memory device shown in FIG. 1. The addressing circuits 20 provide addresses to the row decoder 11, the column decoder 12, and to the page buffer 15. An I/O bus 19 is coupled to the page buffer 15.

A state machine 21 for page mode read, erase and program operations, including program-while-verify operations, is included on the integrated circuit. In support of the operations of the state machine, read, erase and program supply voltages are generated and controlled by circuitry 22 on the circuit. The state machine 21 comprises a processor executing instructions, programmable logic structures, dedicated logic, or various combinations thereof.

The array 10 is configured so that the set of cells arranged to store a page of data identified by identical higher order address bits comprises a first part that is coupled to a first word line, and a second part that is coupled to a second word line. The state machine 21 and decoders 11 and 12 are configured so that a program bias can be applied to bit lines and word lines coupled to cells storing a chunk of data in the first part of the page, while a program verify bias is applied to bit lines and word lines coupled to cells storing another chunk of data in the second part of the page. In a ping-pong type operation, the program-while-verify operation includes a sequence that programs cells in the first part of the page while verifying cells in the second part of the page, then programs cells in the second part of the page while verifying cells in the first part of the page. Thus, the time required for programming data in the first part of the page substantially overlaps with the time required for verifying data in the second part of the page. Where each part of the page requires multiple program and program verify steps to achieve precise control over cell threshold voltages, the program operation can be achieved by applying technology described herein with little or no additional time being allotted for verify operations.

Figure 2:
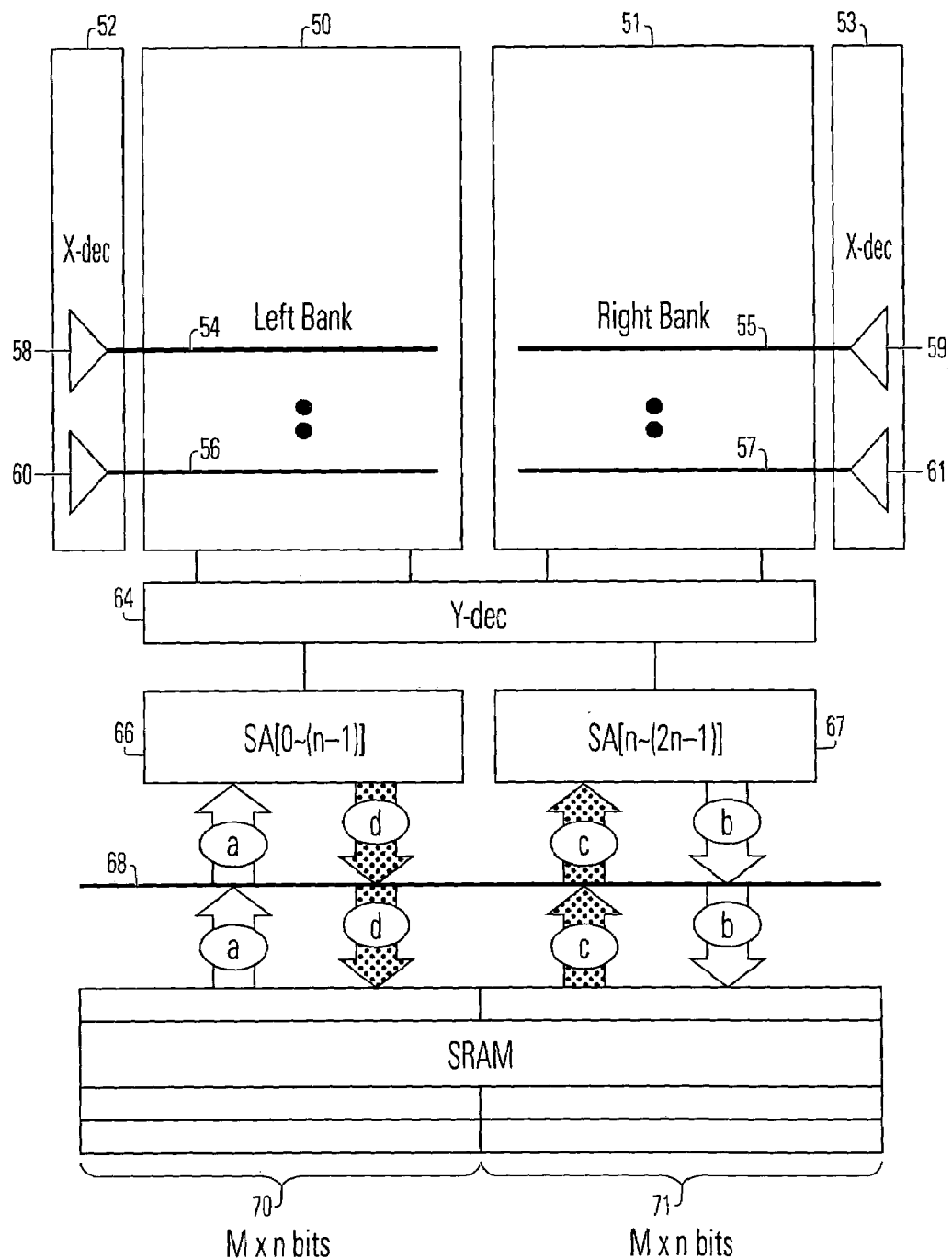
FIG. 2 is a simplified diagram of structures supporting program-while-verify in an integrated circuit memory.

FIG. 2 is a simplified diagram of an array structure having split pages. As shown, the array is organized into a left bank 50 and a right bank 51. X-decoder 52 and X-decoder 53 are coupled to the left bank and the right bank respectively.

Word lines 54 in the left bank and 55 in the right bank are arranged along a row of memory cells in the array. Word line drivers 58 and 59 drive the word line 54 and word line 55 respectively in response to the X-decoders 52, 53 based on a page address, which includes higher order bits of an address for a memory cell. During a program operation, the bias voltages applied by the word line drivers 58 and 59 can be separately controlled as described below. Word line drivers 60 and 61 drive word lines 56 and 57 in response to X-decoders 52 and 53 in a similar manner. Y-decoder 64 is coupled to the bit lines in the array, and is operable in response to addresses to select a first chunk of bit lines for a left set 66 of n sense amplifiers SA[0:(n−1)] and a second chunk of bit lines for a right set 67 of n sense amplifiers SA[n:(2n−1)]. During a program operation, the left set 66 and the right set 67 can be selectively operated for applying a program bias or for sensing data, as described below. The sets 66, 67 of sense amplifiers are coupled via bus 68 to the page buffer implemented using static random access memory SRAM or other read/write storage technology. The page buffer includes a left bank 70 storing a plurality of n-bit chunks of data (M×n bits) and a right bank 71 storing a plurality of n-bit chunks of data (M×n bits). The page buffer can be logically or physically separated into left and right banks in various embodiments. Conceptually, a program operation includes the data flow represented by arrows (a)–(d) in FIG. 2. The data flow arrow (a) represents loading a chunk of data from the page buffer to bit latches associated with the left set 66 of sense amplifiers and applying program bias for programming of the left bank 50. The data flow arrow (b) represents applying verify bias, sensing data from the cell and updating of the data in the page buffer in response to a verify operation on the right bank 51, and can be accomplished while the operation represented by data flow arrow (a) is accomplished. The data flow arrow (c) represents loading a chunk of data from the page buffer to bit latches associated with the right set 67 of sense amplifiers and applying program bias for programming of the right bank 51. The data flow arrow (d) represents applying verify bias, sensing data from the cell and updating of the data in the page buffer in response to a verify operation on the left bank 50, and can be accomplished while the operation represented by data flow arrow (c) is accomplished. Thus a first part of the page of data that is stored in cells coupled to the word lines 54 and 55 is programmed while a second part of the page of data that is stored in cells coupled to word lines 54 and 55 is verified using separate data paths and bias voltages.

Figure 3:
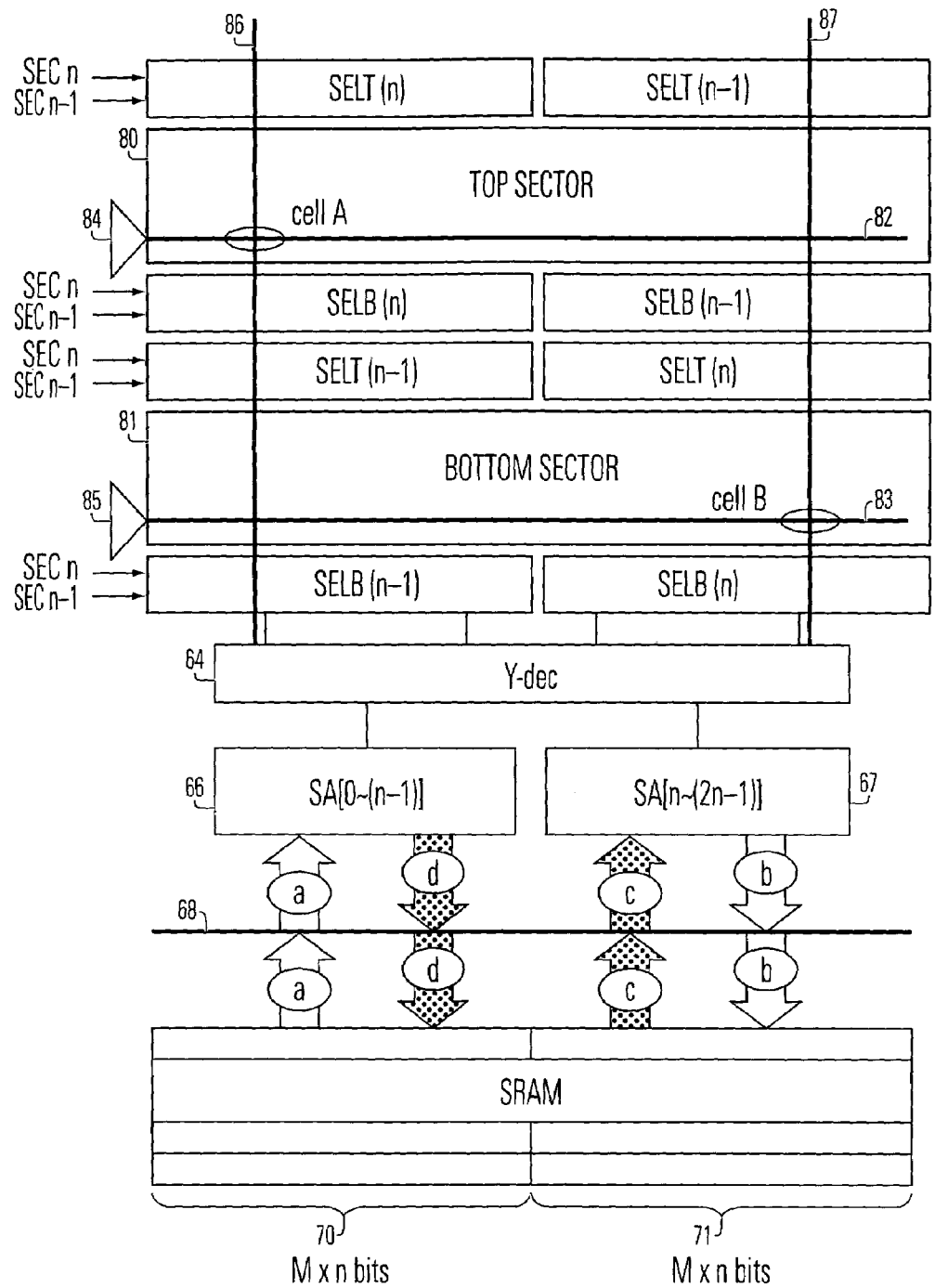
FIG. 3 is a simplified diagram of alternative structures supporting program-while-verify in an integrated circuit memory.

FIG. 3 is a simplified diagram of an alternative array structure having split pages. As shown the array is organized into a top sector 80 and a bottom sector 81, including word line 82 arranged along a row of cells in the top sector 80 and word line 83 arranged along a row of cells in the bottom sector 81. An X-decoder (not shown) selects word line drivers 84 and 85, which drive word lines 82 and 83 respectively, in response to an identical page address.

The top sector 80 includes a left bank in which global bit lines, such as bit line 86, are connected and disconnected to local bit lines coupled to the cells in corresponding columns using a top select structure SELT(n) and a bottom select structure SELB(n). The top select structure SELT(n) and bottom select structure SELB(n) are controlled by the sector select lines SECn, that are in turn generated by a sector decoder. In addition, the top sector 80 includes a right bank in which global bit lines, such as bit line 87, are connected and disconnected to local bit lines coupled to the cells in corresponding columns using a top select structure SELT (n−1) and a bottom select structure SELB(n−1), which are controlled by the sector select lines SECn−1.

The bottom sector 81 includes a left bank in which global bit lines, such as bit line 86, are connected and disconnected to local bit lines coupled to the cells in corresponding columns using a top select structure SELT(n−1) and a bottom select structure SELB(n−1). The top select structure SELT(n−1) and bottom select structure SELB(n−1) are controlled by the sector select lines SECn-1, that are in turn generated by a sector decoder. In addition, the bottom sector 81 includes a right bank in which global bit lines, such as bit line 87, are connected and disconnected to local bit lines coupled to the cells in corresponding columns using a top select structure SELT(n) and a bottom select structure SELB(n), which are controlled by the sector select lines SECn.

Also shown in FIG. 3 are the column decoding, sense amplifier and page buffer structures, described above with reference to FIG. 2, which are given like reference numerals.

Accordingly, the array shown in FIG. 3 is arranged so that a first part of the page of data is stored in memory cells, such as cell A, in the left bank of the top sector 80, and a second part of the page of data is stored in memory cells, such as cell B, in the right bank of the bottom sector 81. In this manner, bias voltages applied to the word line 82 and delivered to cell A can be different from the bias voltages applied to word line 83 and delivered to cell B during a program operation.

Figure 4:
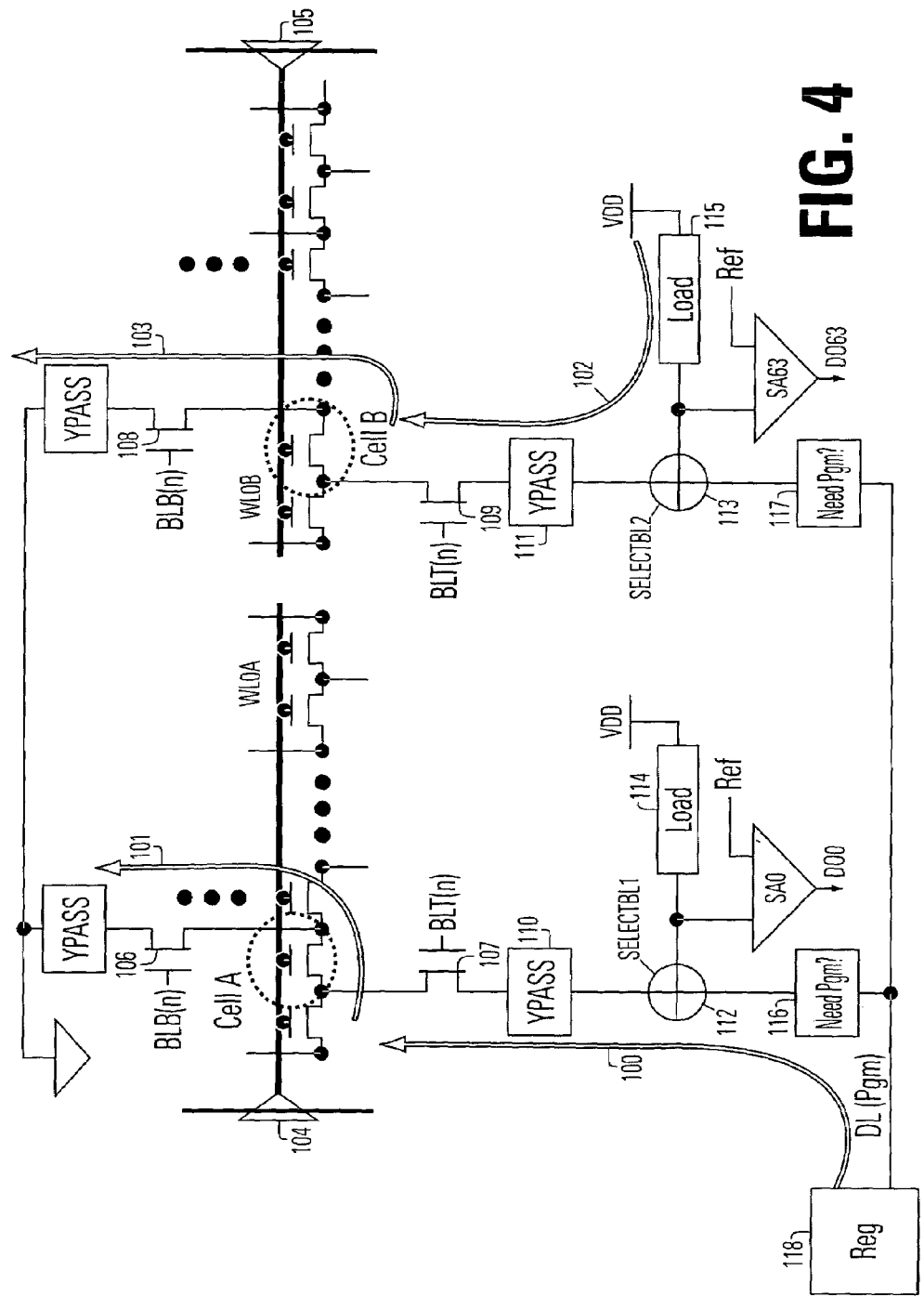
FIG. 4 illustrates circuitry coupled with a column decoder and bit lines, supporting program-while-verify operations in an integrated circuit memory.

FIG. 4 illustrates the current flow paths for a program-while-verify operation in an embodiment of the memory device having split pages, such as described with reference to FIG. 2. Basically, the program operation for cell A in a first part of the page is executed along current flow paths 100 and 101, while the verify operation for cell B in a second part of the page is executed along current flow paths 102 and 103. As illustrated, cell A is situated in a row of memory cells coupled to word line WL0A, while cell B is situated in a row of memory cells coupled to word line WL0B. The word line WL0A is controlled by word line driver 104, while the word line WL0B is controlled by word line driver 105 in the illustrated embodiment. The word line drivers 104 and 105 can be operated selectively during a program-while-verify operation to apply different bias voltages, using structures such as those described below with reference to FIG. 5.

Cell A, and other cells in the left bank of the array, are coupled via local bit lines to a top select structure including the top block transistor 107 controlled by signal BLB(n), and a bottom select structure including the bottom block transistor 106 controlled by signal BLT(n). From the top block transistor 107, the current flow proceeds to a global bit line through Y-pass transistors 110 which are part of the column decoder circuitry, to a selector 112 controlled by the signal SELECTBL1. The selector 112 is controlled during a program operation to direct a current flow to a bit latch 116, referred to as a "need pgm?" latch. The bit latch 116 is powered by a voltage regulator 118, which delivers the program bias voltage under the control of the control state machine on the device. The voltage regulator 118 is driven by on-chip charge pumps and off-chip power supplies in various embodiments of the described technology.

In a representative embodiment, the memory cells comprise nitride charge trapping cells or floating gate cells, programmed by channel hot electron injection which is induced by applying a high positive voltage on a bit line with a positive voltage on the word line, and ground on the source. The selector 112 is controlled during a verify operation, or during a read operation, to direct current flow through the load 114. The voltage applied to the bit line during a sensing operation is also a positive voltage delivered through the load 114. Sense amplifier SA0 is coupled to the load 114, and generates sensed output data DO0.

Cell B, and other cells in the right bank of the array, are coupled via local bit lines to a top select structure including the top block transistor 109, controlled by signal BLB(n), and a bottom select structure including the bottom block transistor 108 controlled by signal BLT(n). From the top block transistor 109, the current flow proceeds to a global bit line through Y-pass transistors 111 which are part of the column decoder circuitry, to a selector 113 controlled by the signal SELECTBL2. The selector 113 is controlled during a read or verfiy operation to direct a current flow through the load 115. Sense amplifier SA63 is coupled to the load 115, and generates sensed output data DO63. During a verify operation, the sensed output data DO63 is compared with data in the bit latch 117, or data in a page buffer corresponding to the memory cell, to determine whether a program pulse needs to be applied to the cell in a following program operation. The selector 112 is controlled during a program operation to direct current flow to a bit latch 117, referred to as a "need pgm?" latch. The bit latch 117 is powered by a voltage regulator 118, which delivers the program bias voltage under the control of the control state machine on the device.

Figure 5:
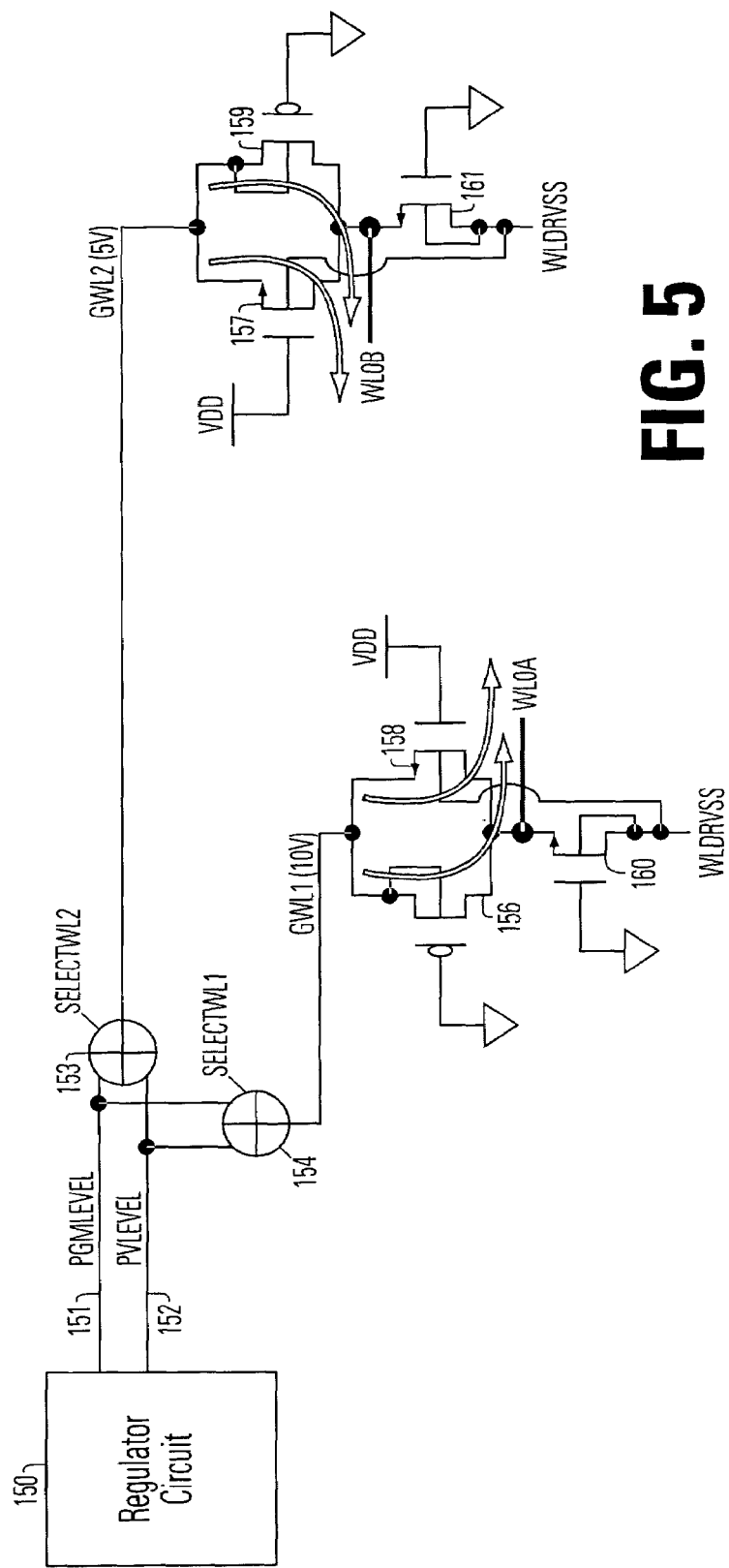
FIG. 5 illustrates circuitry coupled with a row decoder and word lines, supporting program-while-verify operations in an integrated circuit memory.

FIG. 5 illustrates structures and word line drivers used for applying different bias voltages to word line WL0A and word line WL0B, during a program-while-verify operation. The structures include a regulator circuit 150 which delivers a program level voltage on line 151 and a program verify level voltage on line 152. In the example applying channel hot electron injection, as mentioned above, the program bias and the program verify bias are both positive voltages that can be applied at the same time to the array. The regulator circuit 150 is driven by on-chip charge pumps and off-chip power supplies in various embodiments of the described technology. The voltages on lines 151 and 152 are applied to a first selector 154 that is controlled by the signal SELECTWL1 and to a second selector 153 that is controlled by the signal SELECTWL2.

During an operation applying a program bias to word line WL0A, selector 154 is operated to apply the program level voltage on the global word line GWL1, at for example about 10 V in one embodiment. The global word line GWL1 is applied to word line drivers in the left bank of the array, including the driver coupled to the word line WL0A, comprising transistors 156, 158 and 160. Transistor 156 is a p-channel transistor formed in a well that is coupled to its drain. Transistors 158 and 160 are n-channel transistors, each having its well coupled to the bias line WLDRVSS, which is typically ground, or another reference level, like a program inhibit voltage, applied to the word line drivers. When the word line WL0A is selected, the decoder circuitry will apply a ground signal to the gates of transistor 156 and 160, and a supply potential to the gate of transistor 158. The program voltage from the global word line GWL1 flows through the transistors 156 and 158 to the word line WL0A.

During an operation applying a program verify bias to word line WL0B, selector 153 is operated to apply the program verify level voltage on the global word line GWL2, at for example about 5 V in one embodiment. The global word line GWL2 is applied to word line drivers in the right bank of the array, including the driver coupled to the word line WL0B, comprising transistors 157, 159 and 161. Transistor 159 is a p-channel transistor formed in a well that is coupled to its drain. Transistors 157 and 161 are n-channel transistors, each having its well coupled to the bias line WLDRVSS, which is typically ground or another reference level, like a program inhibit voltage, applied to the word line drivers. When the word line WL0B is selected, the decoder circuitry will apply a ground signal to the gates of transistor 159 and 161, and a supply potential to the gate of transistor 157. The program verify voltage from the global word line GWL2 flows through the transistors 157 and 159 to the word line WL0B.

Thus, the structures shown in FIG. 4 and FIG. 5 are representative of circuitry on an integrated circuit that supports applying a program bias voltage to memory cells storing data from a page in the left bank of an array, while applying a program verify bias voltage to memory cells storing data from the same page in the right bank of the array, and vice versa.

Figure 6A:
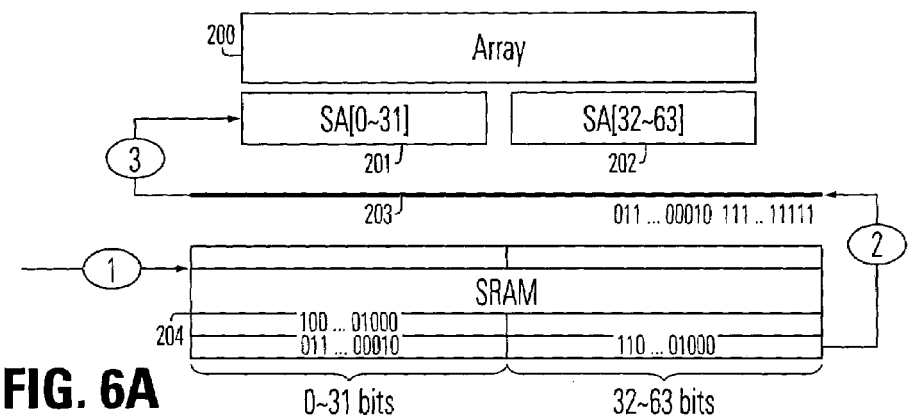
FIGS. 6A–6C comprise simplified diagrams referred to for the purpose of illustrating program-while-verify operations in an integrated circuit memory.
Figure 6B:
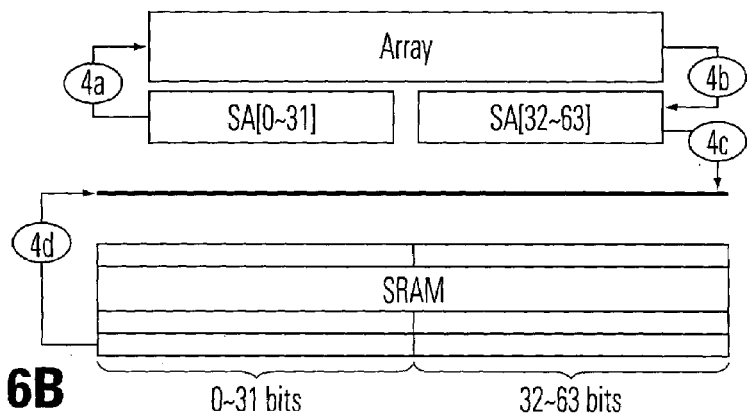
Figure 6C:
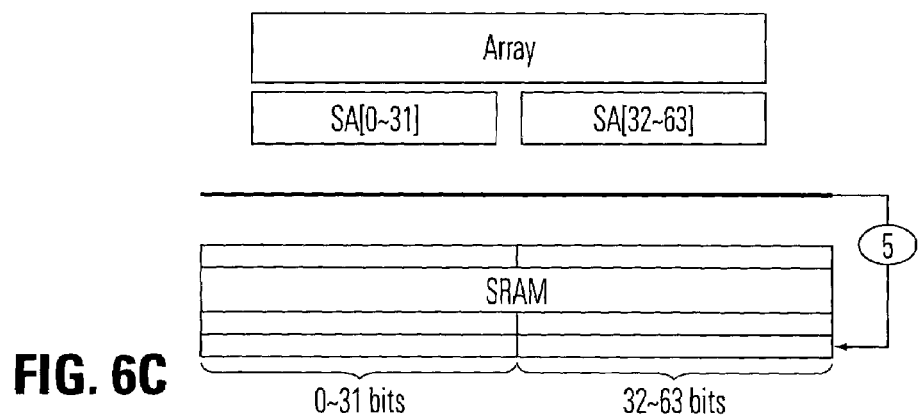

FIGS. 6A–6C are simplified diagrams used for the purpose of the explanation of a program-while-verify sequence. As shown in FIG. 6A, components of the integrated circuit include an array 200, a first set 201 of sense amplifiers SA[0:31] and a second set 202 of sense amplifiers SA[32:63]. A data bus 203 is coupled between the first and second sets 201, 202 of sense amplifiers and a page buffer 204 implemented as an SRAM. In the illustrated example, a chunk of data comprises 32 bits and can be sensed and programmed in parallel using the data structures of a split page device, such as the structures described above with reference to FIGS. 4 and 5.

Three steps of a program-while-verify operation are illustrated in FIG. 6A. In the first step (step 1), a page of data is loaded in the page buffer 204. The page consists of a plurality of 64 bit wide sets of data, each 64 bit wide set including a left chunk consisting of bits 0–31, and a right chunk consisting of bits and 32–34. In the second step (step 2), 64 bits of data are loaded on the bus 203, including the left chunk of data and thirty two 1's in the position of the right chunk of data. In the third step (step 3), data is transferred from the data bus to the bit latches associated with the sense amplifiers. The bit latches associated with sense amplifiers SA[0:31] are loaded with the left chunk of data, while the bit latches associated with sense amplifiers SA[32:63] are loaded with all 1's, where a 1 stored in the bit latch corresponds with a "do-not-program state." After transferring the data out of the SRAM into the bit latches, the process is ready for applying the bias voltages to the array.

FIG. 6B illustrates steps 4a, 4b, 4c and 4d, of the simplified flow, which are executed in parallel so they overlap at least partially in time. In particular, the data from the bit latches associated with sense amplifiers SA[0:31] is programmed into corresponding cells in the left bank of the array 200 (step 4a), while data in cells in the right bank of the array is sensed (step 4b), and then loaded on the bus 203 (step 4c). Meanwhile the first chunk of data is copied back to the bus (step 4d). Steps 4a–4d result in data on the bus that includes the first chunk of data to be programmed unmodified, and the second chunk of data equal to data sensed from corresponding cells in the array prior to programming.

FIG. 6C illustrates the last step in the process, in which the page buffer is updated in response to the program-while-verify sequence. In particular, the data from the bus is compared with the data stored in the page buffer. If the corresponding bit in the page buffer matches the data on the bus, then the value of the bit in the page buffer is updated to "1" indicating a "do-not-program" state because the cycle has verified that the memory cell already stores the correct data. Because of an erase cycle prior to programming as applied in flash memory technologies known in the art, there should not be any cells in the right bank in a programmed state during the first cycle. Therefore, any mismatches of the data sensed from the array with data stored in the page buffer will correspond to bit positions selected for programming.

FIGS. 6A–6C illustrate programming a chunk of data in the left bank while verifying a chunk of data in the right bank. The operation is executed again, with step 2 inverted so that all 1's indicating the "do-not-program" state are loaded into the bit latches associated with sense amplifiers SA[0:31], and steps 4a–4d executed on the opposite side of the array to program bits 32–63 while verifying bits 0–31. During this second cycle, the only cells in the left bank (bits 0–31) in a program state will be those programmed during the previous program-while-verify cycle. Therefore, any mismatches of data sensed from the array with data stored in the page buffer will correspond to bit positions selected for programming, that did not successfully pass program verify. The sequence is repeated on the left and right sides of the array until all the bits in the two chunks of data are successfully programmed. Then, the next two chunks of data are programmed iteratively until the entire page is done.

Figure 7:
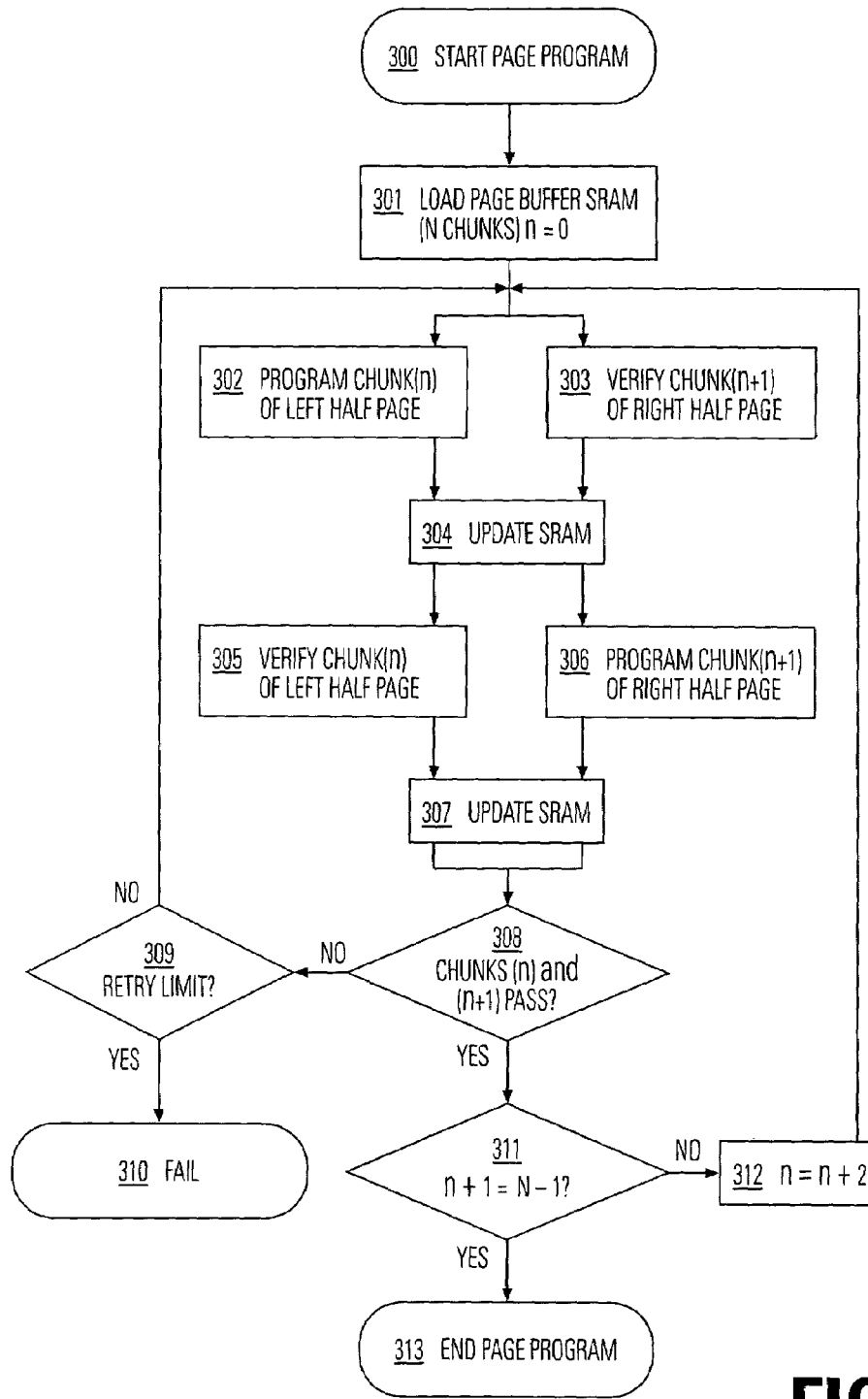
FIG. 7 is a flow chart for a program-while-verify operation suitable for an integrated circuit memory.

FIG. 7 is a flow chart illustrating a page program operation in a program-while-verify device based on split pages. The algorithm starts a page program command (block 300). A page of data is then loaded into the page buffer, where the page comprises an even number N of chunks, and an index n for the algorithm is set to zero (block 301). Next, steps 302 and 303 are executed in parallel, programming chunk(n) in the left half page, and verifying chunk (n+1) in the right half page, applying the procedures such as described above with reference to FIGS. 6A–6C. Next, the page buffer SRAM is updated based on the results of the verify operations (block 304). Next, steps 305 and 306 are executed in parallel, verifying chunk(n) in the left half page, and programming chunk (n+1) in the right half page. Then, the page buffer SRAM is updated again based on the results of the verify operations (block 307). At this point, both chunks (n) and (n+1) have been subjected to one program pulse each. The updated page buffer is checked to determine whether both chunks have passed the verify operation (block 308). If not, the algorithm branches to block 309 determine whether a retry limit has been reached. If the retry limit has not been reached, then the algorithm loops back to steps 302 and 303 to retry the program-while-verify sequence for chunks (n) and (n+1). If at block 309, the retry limit had been reached, then the procedure has failed (block 310).

If at block 308, both chunks (n) and (n+1) pass verify, then the index is tested to determine whether all the chunks in the page have been programmed, by determining whether n+1 is equal to N−1. If all chunks have not been programmed, then the index n is incremented by 2 at block 312. Then the process loops back to steps 302 and 303 to execute the program-while-verify sequence for the next pair of chunks. If at block 311, it is determined that all the chunks in the page have been successfully programmed and verified, then the page program process ends (block 313).

Embodiments of the technology can be applied to memory cells storing multiple bits per cell that require multiple threshold levels to be programmable in a single cell, or one bit per cell as suits the need for a particular application.

The technology described is suitable for use in a wide variety of flash memory architectures, including NOR flash arrays, NAND flash arrays, virtual ground arrays, or other array configurations. The technology described is also suitable for arrays implemented using floating gate memory cells, arrays implemented using nitride charge trapping memory cells, and arrays implemented using other types of memory cells.

Technology described herein provides an integrated circuit memory device including nonvolatile memory where program and program verify processes can be executed at the same time in a split page architecture. Using a split page architecture, the left side and right side of the array can be provided different bias conditions supporting programming and program verifying at the same time. In this manner, the time required for the verify process in one part of the page can be hidden partially or completely during the time required for a program operation on a different part of the page.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for programming a memory device with input data in memory cells identified by respective memory cell addresses, comprising:
   loading a set of data to be stored in a set of memory cells, the set of memory cells consisting of memory cells characterized by having identical higher order address bits in the respective memory cell addresses;
   executing a program sequence, the program sequence including
     first applying a program bias to a first part of the set of memory cells while applying a program verify bias to, and sensing data stored in, a second part of the set of memory cells; and
     second applying the program bias to the second part of the set of memory cells while applying the program verify bias to, and sensing data stored in, the first part of the set of memory cells.

2. The method of claim 1, wherein said set of memory cells comprises cells in a row of cells in a memory array, and wherein the first part of the set of memory cells is coupled to a first word line along the row and the second part of the set of memory cells is coupled to a second word line along the row.

3. The method of claim 1, wherein said set of memory cells comprises cells in a first row of memory cells in a first sector coupled to a first word line along the first row, and cells in a second row of memory cells in a second sector coupled to a second word line along the second row.

4. The method of claim 1, including:
   storing a page of data in a buffer on the memory device, to be stored in a corresponding page of memory cells identified by said higher order address bits; and
   wherein the set of data includes data from said page.

5. The method of claim 1, including:
   storing a page of data in a buffer on the memory device, to be stored in a corresponding page of memory cells identified by said higher order address bits; and
   wherein the page of data includes a plurality of chunks of data that can be sensed in parallel, and said first part comprises a first chunk from the plurality of chunks and the second part comprises a second chunk from said plurality of chunks.

6. The method of claim 1, including:
   storing a page of data in a buffer on the memory device, to be stored in a corresponding page of memory cells identified by said higher order address bits; and
   wherein the page of data includes a plurality of chunks of data that can be sensed in parallel, and said first part comprises a first chunk from the plurality of chunks and the second part comprises a second chunk from said plurality of chunks, and further including repeatedly executing said program sequence to program the plurality of chunks of the page.

7. The method of claim 6, wherein said page comprises at least 1000 bits and said chunks comprise at least 16 bits.

8. The method of claim 1, wherein said program sequence includes updating the set of data in response to said sensing in the first applying and in said second applying, and if the updated set of data does not indicate success of the programming sequence, then retrying the program sequence in response to the updated set of data.

9. An integrated circuit, comprising:
   an array of memory cells, including a plurality of bit lines and a plurality of word lines;
   decoder circuitry coupled to the plurality of bit lines and the plurality of word lines responsive to addresses to access memory cells in the array;
   sense circuitry coupled to the array, the sense circuitry arranged to sense data in a plurality of memory cells in parallel;
   buffer circuitry coupled to the array; and
   circuitry coupled to the array, the decoder circuitry and the buffer, to control execution of program operations, the program operations including
   a load sequence to load a set of data in the buffer circuitry, the set of data to be stored in a set of memory cells in the array, the set of memory cells consisting of memory cells accessible by addresses having identical higher order address bits; and
   a program sequence, the program sequence including
     first applying a program bias to a first part of the set of memory cells while applying a program verify bias to, and sensing data stored in, a second part of the set of memory cells; and
     second applying the program bias to the second part of the set of memory cells while applying the program verify bias to, and sensing data stored in, the first part of the set of memory cells.

10. The integrated circuit of claim 9, wherein said set of memory cells comprises cells in a row of cells in a memory array, and wherein the first part of the set of memory cells is coupled to a first word line along the row and the second part of the set of memory cells is coupled to a second word line along the row, and wherein said decoder circuitry enables word line drivers for the first word line and the second word line in response to said identical higher order address bits, and selectively applies the program bias and the program verify bias to the first and second word lines during the program sequence.

11. The integrated circuit of claim 9, wherein said set of memory cells comprises cells in a first row of memory cells in a first sector coupled to a first word line along the first row, and cells in a second row of memory cells in a second sector coupled to a second word line along the second row, and wherein said decoder circuitry enables the first sector and the second sector and word line drivers for the first word line and the second word line in response to said identical higher order address bits, and selectively applies the program bias and the program verify bias to the first and second word lines during the program sequence.

12. The integrated circuit of claim 9, wherein said buffer circuitry comprises a page buffer to store a page of data, to be stored in a corresponding page of memory cells identified by said higher order address bits.

13. The integrated circuit of claim 9, wherein said buffer circuitry comprises a page buffer to store a page of data, to be stored in a corresponding page of memory cells identified by said higher order address bits, and latches coupled with the decoder circuitry which store a chunk of data that can be programmed in parallel,
    wherein the page of data includes a plurality of chunks of data that can be sensed in parallel, and said first part comprises a first chunk from the plurality of chunks and the second part comprises a second chunk from said plurality of chunks.

14. The integrated circuit of claim 13, wherein said program operations include:
    repeatedly executing said program sequence to program the plurality of chunks of the page.

15. The integrated circuit of claim 14, wherein said page comprises at least 1000 bits and said chunks comprise at least 16 bits.

16. The integrated circuit of claim 9, wherein said buffer circuitry comprises latches coupled with the decoder circuitry which store a chunk of data that can be programmed in parallel, and said program sequence includes updating data in the latches in response to said sensing in the first applying and in said second applying, and if the updated data does not indicate success of the programming sequence, then retrying the program sequence in response to the updated data.

17. An integrated circuit, comprising:
    an array of memory cells, including a plurality of bit lines and a plurality of word lines;
    decoder circuitry coupled to the plurality of bit lines and the plurality of word lines responsive to addresses to access memory cells in the array;
    sense circuitry coupled to the array, the sense circuitry arranged to sense data in a plurality of memory cells in parallel;
    buffer coupled to the array, including a page buffer and bit latches coupled to the decoder circuitry; and
    circuitry coupled to the array, the decoder circuitry and the buffer, to control execution of program operations, the program operations include iteratively executing a load sequence and a program sequence for a plurality of sets of data to program the data of the page, wherein the load sequence loads a set of data from the page buffer to the bit latches, the set of data to be stored in a set of memory cells in the array, the set of memory cells consisting of memory cells accessible by addresses having an identical page address; and
    the program sequence including
        first applying a program bias to a first part of the set of memory cells while applying a program verify bias to, and sensing data stored in, a second part of the set of memory cells;
        second applying the program bias to the second part of the set of memory cells while applying the program verify bias to, and sensing data stored in, the first part of the set of memory cells; and
        updating data in the buffer circuitry in response to said sensing in the first applying and in said second applying, and if the updated data does not indicate success of the programming sequence, then retrying the program sequence in response to the updated data.

18. The integrated circuit of claim 17, wherein said set of memory cells comprises cells in a row of cells in a memory array, and wherein the first part of the set of memory cells is coupled to a first word line along the row and the second part of the set of memory cells is coupled to a second word line along the row, and wherein said decoder circuitry enables word line drivers for the first word line and the second word line in response to said identical page address, and selectively applies the program bias and the program verify bias to the first and second word lines during the program sequence.

19. The integrated circuit of claim 17, wherein said set of memory cells comprises cells in a first row of memory cells in a first sector coupled to a first word line along the first row, and cells in a second row of memory cells in a second sector coupled to a second word line along the second row, and wherein said decoder circuitry enables the first second and the second sector and word line drivers for the first word line and the second word line in response to said identical page address, and selectively applies the program bias and the program verify bias to the first and second word lines during the program sequence.

20. The integrated circuit of claim 17, wherein said page comprises at least 1000 bits and said first part and said second part comprise at least 16 bits.

* * * * *

UNITED STATES PATENT AND TRADEMARK OFFICE
CERTIFICATE OF CORRECTION

| | | |
|---|---|---|
| PATENT NO. | : 7,130,222 B1 | Page 1 of 1 |
| APPLICATION NO. | : 11/235881 | |
| DATED | : October 31, 2006 | |
| INVENTOR(S) | : Wen-Chiao Ho et al. | |

It is certified that error appears in the above-identified patent and that said Letters Patent is hereby corrected as shown below:

Column 14, line 39: replace

"wherein said decoder circuitry enables the first second" and with

-- wherein said decoder circuitry enables the first sector and --

Signed and Sealed this

Twenty-third Day of January, 2007

JON W. DUDAS
*Director of the United States Patent and Trademark Office*